(12) United States Patent
Namiwaka et al.

(10) Patent No.: US 6,965,627 B2
(45) Date of Patent: Nov. 15, 2005

(54) SEMICONDUCTOR LASER MODULE

(75) Inventors: Masahiko Namiwaka, Tokyo (JP); Masahiro Kanda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/143,754

(22) Filed: May 14, 2002

(65) Prior Publication Data

US 2002/0172252 A1 Nov. 21, 2002

(30) Foreign Application Priority Data

May 16, 2001 (JP) ........................................ 2001-145738

(51) Int. Cl.⁷ .............................................. H01S 3/08
(52) U.S. Cl. ............................... 372/92; 372/6; 372/98; 372/102
(58) Field of Search ............................... 372/6, 92, 98, 372/102

(56) References Cited

U.S. PATENT DOCUMENTS

| 5,166,940 | A | * | 11/1992 | Tumminelli et al. | ........... | 372/6 |
| 5,305,335 | A | * | 4/1994 | Ball et al. | ....................... | 372/6 |
| 5,771,250 | A | * | 6/1998 | Shigehara et al. | ............. | 372/6 |
| 6,233,259 | B1 | | 5/2001 | Ventrudo et al. | | |
| 6,407,855 | B1 | * | 6/2002 | MacCormack et al. | ........ | 372/6 |

FOREIGN PATENT DOCUMENTS

| JP | 61-32488 | | 2/1986 |
| JP | 10-293234 | | 11/1998 |
| JP | 11-163471 | A | 6/1999 |
| JP | 2000082864 | A | 3/2000 |
| JP | 2000-131559 | | 5/2000 |
| JP | 2000174381 | A | 6/2000 |
| JP | 2000-194023 | | 7/2000 |
| JP | 2001-144370 | | 5/2001 |
| JP | 2001-160652 | | 6/2001 |
| WO | WO00/02561 | | 1/2000 |
| WO | WO00/45482 | | 8/2000 |

OTHER PUBLICATIONS

Journal of Lightwave Technology, vol. 15, No. 8, Aug. 1997.
European Search Report dated Jan. 7, 2004.
Jean–Luc Archambault, et al. "Fiber Gratings in Lasers and Amplifiers", Journal of Lightwave Technology, vol. 15, No. 8., Aug. 1997, pp. 1378–1390.
R. Kashyap "Fiber Grating Band–Pass Filters", 1999, Academic Press, U.S.A., pp. 227–246.
K. Sugden, et al., "Fabrication and Characterization of Bandpass Filters Based on Concatenated Chirped Fiber Gratings", Journal of Lightwave Technology, vol. 15, No. 8, Aug. 1997, pp. 1424–1432.
S. Legoubin, et al. "Free Spectral Range Variations of Grating–Based Fabry–Perot Filters Photowritten in Optical Fibers", Journal of the Optical Society of America, vol. 12, No. 8, Aug. 1, 1995, pp. 1687–1694.
European Patent Search dated Jun. 4, 2004.
"Fiber Gratings in Lasers and Amplifiers", Authors: Jean–Luc Archambault and Stephen G. Grug, *Journal of Lightwave Technology*, vol. 15, No. 8, Aug. 1997.
*Fiber Bragg Gratings*, Academic Press, pp 227, 246.
Fabrication and Characterization of Bandpass Filters Based on Concatenated Chirped Fiber Gratings, Authors: K. Sugden, L. Zhang, J.A.R. Williams, R.W. Fallon, L.A. Everall, K.E. Chisholm and I. Bennion, *Journal of Lightwave Technology*, vol. 15, No. 8, Aug. 1997.

(Continued)

*Primary Examiner*—Minsun Oh Harvey
*Assistant Examiner*—Cornelius Jackson
(74) *Attorney, Agent, or Firm*—McGinn & Gibb, PLLC

(57) ABSTRACT

Fiber gratings (5), (6) having substantially the same reflection center wavelength are provided in an optical fiber (4). The fiber gratings (5), (6) reflects to the semiconductor laser element (1), only a component at the reflection center wavelength of laser light emitted from the semiconductor laser element (1).

22 Claims, 2 Drawing Sheets

OTHER PUBLICATIONS

Figure 1:
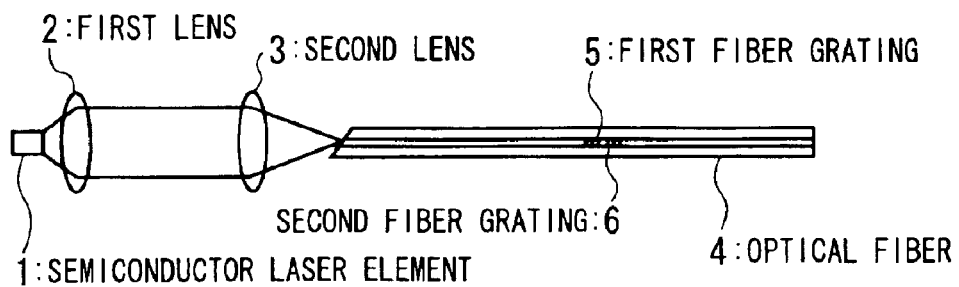

"Free Spectral Range Variations of Grating–Based Fabry–Perot Filters Photowritten in Optical Fibers", Authors: S. Legoubin, M. Douay, P. Bernage and P. Niay, vol. 12, No. 8, Aug. 1995, *J. Opt. Soc. Am. A.*, pp. 1687–1694.

Japanese Office Action dated May 25, 2004, with partial English translation.

Furukawa Denkou Newsletter; No. 106 (Jul. 2000), pp. 77 and 78; "980nm High Output Pump Laser Module".

* cited by examiner

US 6,965,627 B2

SEMICONDUCTOR LASER MODULE

BACKGROUND OF THE INVENTION

1. Field of the Invention

The present invention relates to a semiconductor laser module, and more particularly to a semiconductor laser module having an external resonator.

2. Related Art

In a semiconductor laser module of the past, the most general technology for stabilizing the wavelength of the laser light output from the module was that of forming in an optical fiber one fiber grating having a diffraction grating at a wavelength at which the semiconductor laser can oscillate, and to form an external resonator by the rear surface (Hr surface) of the semiconductor laser element and the fiber grating formed on the optical fiber.

For example, in Journal of Lightwave Technology, Vol. 15, No. 8, August 1997, there is a description of technology in which an external resonator is formed by a 980 nm band laser element and a fiber grating formed in an optical fiber (the center reflected wavelength of which is 975 nm having a reflectivity of 2 to 4%), thereby stabilizing the wavelength of the laser light emitted from the semiconductor laser module to 975 nm.

The above-noted technology, intended for the purpose of stabilizing the wavelength of the laser light output from a semiconductor laser module, has the following problem.

Specifically, because there is a limit to the center oscillation wavelength of the semiconductor laser element which can be pulled in by a fiber grating, the farther mutually removed are the center reflection wavelength of the fiber grating and the center oscillation wavelength of the semiconductor laser element, the more difficult it is to pull in the laser light emitted from the semiconductor laser element to the wavelength of the fiber grating. In this case, therefore, there is the problem of additional oscillation at the stand-alone oscillation wavelength of the semiconductor laser element in addition to the oscillation at the wavelength established by the fiber grating, thereby causing the light output to have an unstable wavelength.

With further distance between the fiber grating reflection center wavelength and the center oscillation wavelength of the semiconductor laser element, it becomes absolutely impossible to pull in the laser light from the semiconductor laser element to the wavelength established by the fiber grating, resulting in the semiconductor laser element oscillating at its own center oscillation wavelength, with light being output from the semiconductor laser module at this stand-alone semiconductor laser element oscillation wavelength.

Technology intended for solving the above-noted problem is proposed in the Japanese Unexamined Patent Publication (KOKAI) No. 2000-131559 (hereinafter referred to as the first disclosure), which shows a laser diode module. The laser diode module of the first disclosure is one in which a laser diode light source with an internal laser diode chip is optically coupled to an optical fiber. The optical fiber is a grating fiber, the reflection center wavelength of which is established so as to be 2 to 10 nm shorter than the oscillation center wavelength of the laser diode chip at 25° C.

More specifically, in the laser diode module of the first disclosure, a chip having oscillation center wavelengths of 968 nm at 0° C., 975 nm at 25° C. and 981 nm at 40° C. is used as the laser diode chip, and the center reflection center wavelength of the optical fiber grating is set to be 970 nm. In a laser diode module having this configuration, according to the first disclosure, over a temperature variation of ±25° C. with respect to the normal ambient temperature of 25° C., it is possible to lock the laser diode oscillation center wavelength to the fiber grating reflection center wavelength of 970 nm.

With the above-noted technology of the first disclosure, however, when fabricating a semiconductor laser module because it is necessary to achieve somewhat of a coincidence between the semiconductor laser element oscillation center wavelength and the reflection center wavelength of the fiber grating, it is necessary to select the semiconductor laser element to be used, this being disadvantageous from the standpoint of fabricating a low-cost semiconductor laser module.

Given the above, in order to stabilize the wavelength of the laser light from a semiconductor laser module, and also solve the above-noted problem with the technology of the first disclosure, the oscillation center wavelength range of the semiconductor laser module that can be pulled into the wavelength of the fiber grating can be broadened. The oscillator center wavelength of a semiconductor laser element that can be pulled into the wavelength of a fiber grating is generally established by the relationship between the front-surface reflectivity of the semiconductor laser element and the fiber grating reflectivity, and it is most effective to make the fiber grating reflectivity high.

However, if the reflectivity of the fiber grating is merely made high, the coherency of the reflected light from the fiber grating as seen from the semiconductor laser element becomes high. Using this approach, therefore, although it is possible to broaden the range of semiconductor laser element oscillation center wavelength that can be pulled in to the wavelength of a fiber grating, problems arise such as a kink occurring in the light output characteristics after the module is fabricated.

Technology intended to stabilize the light output characteristics is also proposed in the Japanese Unexamined Patent Publication (KOKAI) No. H10-293234 (referred to hereinafter as the second disclosure). In a semiconductor laser module described in the second disclosure, fiber gratings which reflect light of mutually different wavelengths is formed in an optical fiber. These two fiber gratings are formed within the package that holds the semiconductor laser chip, or in a location at which a coupling means that couples the package to an optical fiber is disposed.

Although with a semiconductor laser module as described in the second disclosure, it is possible to stabilize the light output characteristics, because the reflection center wavelengths of the two fiber gratings forming in the optical fiber mutually differ, there is the problem of oscillation in two modes having different wavelengths.

In the Japanese Unexamined Patent Publication (KOKAI) No. 2000-194023 (hereinafter referred to as the third disclosure), there is a description of a semiconductor laser module in which two fiber gratings having mutually different reflection wavelengths, wherein the reflection center wavelengths of these two fiber gratings are set as to be above and below a prescribed wavelength of the light emitted from a semiconductor laser element.

Because the semiconductor laser module of the third disclosure is configured as noted above, in the case in which the oscillation center wavelength of the semiconductor laser module is shorter than the reflection center wavelengths of the two fiber gratings, oscillation occurs at only the wavelength established by the fiber grating having the shorter reflection center wavelength. Further in the case in which the oscillation center wavelength of the semiconductor laser module is between two reflection center wavelengths of the two fiber gratings, oscillations occur at the two wavelength established by the two fiber grating. Similarly, in the case in which the oscillation center wavelength of the semiconductor laser module is longer than the reflection center wavelengths of the two fiber gratings, oscillation occurs at only the wavelength established by the fiber grating having the longer reflection center wavelength. Thus, with a semiconductor laser module according to the third disclosure, there is the problem that the wavelength of the laser light obtained from the optical fiber will differ, depending upon the oscillation center wavelength of the semiconductor laser module.

Accordingly, it is an object of the present invention to provide a semiconductor laser module capable not only of stabilizing the wavelength of the laser light even if there is variation in the oscillation center wavelength of the semiconductor laser element, but also of limiting variation in the light output characteristics.

SUMMARY OF THE INVENTION

In order to achieve the above-noted object, the present invention adopts the following basic technical constitution.

Specifically, a first aspect of the present invention is a semiconductor laser module comprising: a semiconductor laser element; an optical fiber optically coupled to the semiconductor laser element; and a plurality of fiber gratings provided in the optical fiber; wherein a center wavelength of a reflecting light of the fiber gratings is established to be substantially equal each other.

The second aspect of the present invention is a semiconductor laser module comprising: a semiconductor laser element; an optical fiber optically coupled to the semiconductor laser element; and a plurality of fiber gratings provided in the optical fiber; wherein a center wavelength of a reflecting light of the fiber gratings is established to be equal each other.

In the third aspect of the present invention, a wavelength difference among said center wavelengths of said plurality of fiber gratings is 1.0 nm or less.

In the fourth aspect of the present invention, a distance between one of the fiber gratings and the semiconductor laser element is 50 cm or greater.

The above-described present invention operates in the following manner. A plurality of fiber gratings having substantially the same different reflection center wavelengths are formed in an optical fiber, this plurality of fiber gratings reflecting to the semiconductor laser module only components of the reflection center wavelength of the laser light emitted from the semiconductor laser element. In this manner, by using a plurality of fiber gratings having substantially one and the same reflection center wavelength, even if the wavelength of the laser light emitted from the semiconductor laser element changes greatly, because it is possible to pull the laser light into the plurality of fiber gratings, it is possible to stabilize the wavelength of the laser light emitted from the semiconductor laser element to the reflection center wavelength. Additionally, in contrast to the case in which the reflectivity of the fiber grating is merely made high, it is possible to prevent an increase in the coherency of the reflected light as seen from the semiconductor laser element, thereby enabling the achievement of output characteristics without a kink.

BRIEF DESCRIPTIONS OF THE DRAWINGS

FIG. 1 is a drawing showing the configuration of a semiconductor laser module according to a first embodiment of the present invention.

Figure 2:
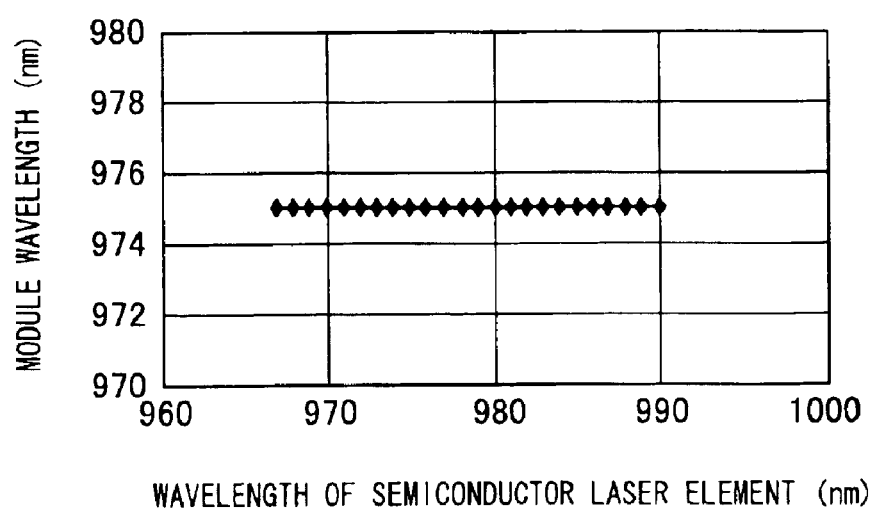

FIG. 2 is a graph showing the oscillation center wavelength range of the semiconductor laser element 1 capable of being pulled in by the fiber gratings 5 and 6 of the semiconductor laser module of FIG. 1.

Figure 3:
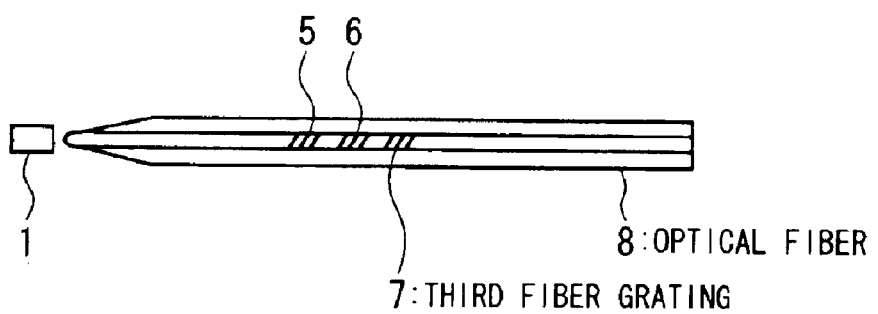

FIG. 3 is a drawing showing the configuration of a semiconductor laser module according to a second embodiment of the present invention.

DETAILED DESCRIPTION OF THE PREFERRED EMBODIMENTS

Embodiments of the present invention are described in detail below, with reference made to relevant accompanying drawings.

First Embodiment

FIG. 1 shows the configuration of a semiconductor laser module according to a first embodiment of the present invention, which has, as shown in FIG. 1, a semiconductor laser element 1, a first lens 2, a second lens 3, and an optical fiber 4.

The semiconductor laser module of the first embodiment of the present invention has a high-efficiency optical coupling between the semiconductor laser element 1 and the optical fiber 4, wherein the laser light emitted from the semiconductor laser element 1 is extracted via the optical fiber 4.

In the semiconductor laser module of the first embodiment, even if there is a large change in the oscillation center wavelength of the semiconductor laser element 1 due to a change in temperature or the like, in order that there is no change in the wavelength of the laser light output from the module itself, a first fiber grating 5 and a second fiber grating 6 having substantially same reflection center wavelength, respectively, are provided in the optical fiber 4.

The first lens 2 is a lens that converts the emitted light from the semiconductor laser element 1 to the parallel light. The second lens 3 is a lens that focuses the parallel light from the first lens 1 onto the end face of the optical fiber 4, so that it incident thereto with good efficiency. The end face of the optical fiber 4 is polished at an inclination, so that light reflected from the end face does not return to the semiconductor laser element 1. That is, the shape of the end face of the optical fiber 4 is processed so that the light is reflected outside the region of incidence to the second lens 3. The end face of the optical fiber 4 is further coated with a anti-reflective film.

The optical fiber 4 has formed in it a first fiber grating 5 and a second fiber grating 6. Each of the first and second fiber gratings 5 and 6 is formed, for example, by exposing the core part of the optical fiber 4 to ultraviolet light so as to cause a periodic variation in the index of refraction, thereby forming a diffraction grating.

Each of the reflection center wavelengths and half band width of the first fiber grating 5 and the second fiber grating 6 can be respectively set to the a single arbitrary wavelength and half band width to which stabilization is to be achieved within the oscillation range of the semiconductor laser element 1. In this case, the reflection center wavelength of the first fiber grating 5 and the second fiber grating 6 are set to 975 nm, and the half band width of the first fiber grating 5 and the second fiber grating 6 are made to be in the range from 0.5 to 3.0 nm.

Although in the above-noted description the reflection center wavelengths of the first fiber grating 5 and the second fiber grating 6 are set to 975 nm, there is not necessarily any need to set the reflection center wavelength of the first and second fiber gratings to one and the same wavelength. That is, it is sufficient that the reflection center wavelengths of the first fiber grating 5 and the second fiber grating 6 be set to substantially one and the same wavelength.

In this case, if there is too much separation between the reflection center wavelength of the first fiber grating 5 and the reflection center wavelength of the second fiber grating 6, problems can occur of a widening of the half band width of the wavelength extracted form the semiconductor laser module, or of oscillation at each of the wavelengths established respectively by the first fiber grating 5 and the second fiber grating 6.

To prevent the occurrence of these problems, the wavelength difference between the reflection center wavelength of the first fiber grating 5 and the reflection center wavelength of the second fiber grating 6 is set to a value no greater than 1.0 nm. That is, the statement that the reflection center wavelength of the first fiber grating 5 and the reflection center wavelength of the second fiber grating 6 are substantially one and the same means that the wavelength difference between these reflection center wavelengths is 1.0 nm or less.

In order to prevent a high coherency in the light reflected from the first fiber grating 5 and the second fiber grating 6 as seen from the semiconductor laser element 1, it is desirable that the reflectivities of the first fiber grating 5 and the second fiber grating 6 be set to approximately 0.5% to 8%. In this case, the reflectivities of the first and second fiber gratings 5 and 6 are each set to 3%.

It is sufficient to set the distance between the first fiber grating 5 and the semiconductor laser element 1 (strictly speaking, the rear surface of the semiconductor laser element 1) to at least 10 cm. However, in order to lower the coherency of the reflected light from the first and second fiber gratings 5 and 6 as seen from the semiconductor laser element 1, it is desirable to use the weakening of interference of the laser light as it propagates through an optical fiber, and to set the distance between first fiber grating 5 and the semiconductor laser element 1 (strictly speaking, the rear surface of the semiconductor laser element 1) to at least 50 cm.

Although the distance between the first fiber grating 5 and the second fiber grating 6 can be arbitrarily set, it is desirable the distance be no greater than 50 cm, considering the housing of the fiber gratings within the module itself.

The operation of a semiconductor laser module according to the first embodiment is described below, with reference to relevant drawings.

In FIG. 1, the spectrum of the broadened laser light emitted from the semiconductor laser element 1 has relatively wide-band wavelength components. This laser light is converted to parallel light by the first lens 2, and then is collected by the second lens 3. The collected laser light is then focused onto the end face of the optical fiber 4, and is propagated through the optical fiber 4.

Part of the laser light propagated through the optical fiber 4 is reflected by the first fiber grating 5 and the second fiber grating 6. The reflected laser light proceeds in the reverse direction and, after propagating through the optical fiber 4, passes through the second lens 3 and then the first lens 2, after which it returns to the semiconductor laser element 1. An external resonator is formed by the rear surface (Hr surface) of the semiconductor laser element 1 and the fiber gratings 5 and 6, enabling laser oscillation in a wavelength band established by the diffraction gratings of the fiber gratings 5 and 6, which have substantially one and the same reflection center wavelength. The result of this is that laser light with a stabilized wavelength is emitted from a semiconductor laser module according to the first embodiment.

In a semiconductor laser module according to the first embodiment of the present invention, because two laser lights from the first fiber grating 5 and the second fiber grating 6 return to the semiconductor laser element 1, that is, because there are a plurality of reflection points as seen from the semiconductor laser element 1, it is possible to effectively reduce the coherency of the laser light. By doing this, it is possible to eliminate a kink in the light output characteristics, such as the light output versus drive current characteristics.

FIG. 2 shows the range of reflection center wavelength of a semiconductor laser element 1 that can be pulled in to the fiber gratings 5 and 6 of the semiconductor laser module. In FIG. 2, the horizontal axis represents the oscillation center wavelength of the semiconductor laser element 1, and the vertical axis represents the wavelength of the laser light after fabricating into a module. It can be seen from FIG. 2 that using a semiconductor laser module according to the first embodiment of the present invention, over a range of oscillation center wavelength $\Delta\lambda=23$ nm of the semiconductor laser element 1 (oscillation center wavelength: 967 to 990 nm), the wavelength of the laser light emitted from the module itself is stabilized to 975 nm.

Although in the semiconductor laser module according to the first embodiment two fiber gratings are used, It will be understood that this is not a restriction, and that three or more fiber gratings can be formed in the optical fiber 4.

Second Embodiment

A second embodiment of the present invention is described below, with reference to FIG. 3, which shows a semiconductor laser module according to the second embodiment, in which the same elements as in the first embodiment are assigned the same reference numerals. The semiconductor laser module shown in FIG. 3 has a semiconductor laser element 1 and an optical fiber 8.

That is, the semiconductor laser module according to the second embodiment of the present invention differs from that of the first embodiment in that, without using a lens in the optics system thereof, it uses a wedge-shaped fiber, formed by processing the end face of the optical fiber 8. An additional distinction from the semiconductor laser module of the first embodiment is that, in the semiconductor laser module according to the second embodiment, in addition to the first fiber grating 5 and the second fiber grating 6, a third fiber grating 7 is provided in the optical fiber 8.

The reflection center wavelength of the third fiber grating 7 in this case is set so as to be substantially the same as the reflection center wavelength of the first fiber grating 5 and the second fiber grating 6. That is, the wavelength difference between the reflection center wavelength of the third fiber grating 7 and the reflection center wavelength of the first fiber grating 5 is 1.0 nm or less, the wavelength difference between the reflection center wavelength of the third fiber grating 7 and the second fiber grating 6 is 1.0 nm or less, and the wavelength difference between the first fiber grating 5 and the reflection center wavelength of the second fiber grating 6 is 1.0 nm or less.

In the semiconductor laser module according to the second embodiment of the present invention, similar to the semiconductor laser module of the first embodiment, it is clear that not only is the wavelength of the laser light emitted from the module itself stabilized over a wide range of oscillation center wavelength of the semiconductor laser element 1, but also any kink in the light output characteristics is eliminated.

A first effect achieved by the present invention as described in detail above is the prevention of variation in the wavelength of the laser light emitted from the module even if there is a large variation in the oscillation center wavelength of the semiconductor laser element, and avoidance of a kink occurring in the light output characteristics. The reason for this is that, by forming in an optical fiber a plurality of fiber gratings having substantially one and the same reflection center wavelength, it is possible to pull the laser light from the semiconductor laser element into the fiber gratings over a broad range of oscillation center wavelength of the semiconductor laser element. Additionally, because there are a plurality of reflection points as seen from the semiconductor laser element, it is possible to effectively reduce the coherency of the laser light as seen from the semiconductor laser element.

A second effect achieved by the present invention is the provision of a low-cost semiconductor laser module. The reason for this is that, because it is possible to extract laser light with a stabilized wavelength even if there is a large variation in the oscillation center wavelength of the semiconductor laser element, the range of semiconductor laser element usable in the semiconductor laser module is broadened, thereby eliminating the need to select semiconductor laser elements for use in the semiconductor laser module.

What is claimed is:

1. A semiconductor laser module, comprising:
   a semiconductor laser element having a first center wavelength;
   an optical fiber optically coupled to said semiconductor laser element; and
   a plurality of adjacent fiber gratings provided in said optical fiber,
   wherein second center wavelengths of a reflecting light of said plurality of adjacent fiber gratings differ by 1.0 nm or less and
   wherein said semiconductor laser element comprises a reflective rear surface which forms an external resonator with said plurality of fiber gratings.

2. A semiconductor laser module according to claim 1, wherein a distance between one of said plurality of adjacent fiber gratings and said semiconductor laser element is 50 cm or greater.

3. The semiconductor laser module according to claim 1, wherein said reflective rear surface of said semiconductor laser element comprises a reflective end surface.

4. The semiconductor laser module according to claim 1, wherein said external resonator enables laser oscillation in a wavelength band established by the plurality of fiber gratings.

5. The semiconductor laser module according to claim 1, wherein a component at a reflection center wavelength of laser light emitted from said semiconductor laser element is reflected by said plurality of fiber gratings back to said semiconductor laser element.

6. A semiconductor laser module according to claim 1, wherein said plurality of adjacent fiber gratings comprise a first grating and a second grating, said first grating and said second grating having a reflectivity of approximately 0.5% to 8%.

7. A semiconductor laser module according to claim 6, wherein a distance between said first grating and said second grating is no greater than 50 cm.

8. A semiconductor laser module according to claim 1, wherein said plurality of adjacent fiber gratings includes at least two fiber gratings.

9. A semiconductor laser module according to claim 8, wherein said optical fiber includes an end face which faces said semiconductor laser element and is wedge-shaped.

10. A semiconductor laser module according to claim 1, further comprising:
    a first lens that converts light emitted from said semiconductor laser element into collimated rays of light.

11. A semiconductor laser module according to claim 10, further comprising:
    a second lens that focuses said collimated rays of light onto a end face of said optical fiber.

12. A semiconductor laser module according to claim 11, wherein said end face of said optical fiber is polished at an inclination, such that light reflected from said end face does not return to said semiconductor laser element.

13. A semiconductor laser module according to claim 11, wherein said end face is coated with an anti-reflective film.

14. A semiconductor laser module, comprising:
    a semiconductor laser element having a first center wavelength;
    an optical fiber optically coupled to said semiconductor laser element; and
    a plurality of adjacent fiber gratings provided in said optical fiber,
    wherein a second center wavelength of a reflecting light of from each of said plurality of adjacent fiber gratings is equal, and
    wherein said semiconductor laser element comprises a reflective rear surface which forms an external resonator with said plurality of fiber gratings.

15. A semiconductor laser module that stabilizes a wavelength of light emitted from said semiconductor laser module, comprising:
    a semiconductor laser element having a range of oscillation about a first center oscillation wavelength;
    an optical fiber optically coupled to said semiconductor laser element; and
    a plurality of adjacent fiber gratings provided in said optical fiber, each of said plurality of adjacent fiber gratings comprising:
       a second center wavelength of reflected light having components within said range of oscillation about said first center wavelength,
    wherein said second center wavelengths for said plurality of adjacent fiber gratings differ by 1.0 nm or less, and
    wherein said semiconductor laser element comprises a reflective rear surface which forms an external resonator with said plurality of fiber gratings.

16. A semiconductor laser module according to claim 15, wherein said second center wavelength of reflected light corresponding to each of said plurality of adjacent fiber gratings is equal.

17. The semiconductor laser module according to claim 15, wherein said first center oscillation wavelength is in a range from 967 to 990 nm, and a wavelength of laser light emitted from said semiconductor laser module is stabilized to 975 nm.

18. A semiconductor laser module according to claim 15, further comprising:
    a first lens that converts light emitted from said semiconductor laser element into collimated rays of light; and
    a second lens that focuses said collimated rays of light onto an end face of said optical fiber.

19. A semiconductor laser module according to claim 18, wherein said end face of said optical fiber is polished at an inclination, such that light reflected from said end face does not return to said semiconductor laser element.

20. A method of forming an external resonator for a semiconductor laser module that stabilizes a wavelength of light emitted from said semiconductor laser module, said method comprising:

optically coupling a semiconductor laser element to an optical fiber; and forming a plurality of adjacent fiber gratings with said optical fiber, wherein a range of oscillation about a first center wavelength of said semiconductor laser element differs from a component of a second center wavelength of reflected light of each of said plurality of adjacent fiber gratings by 1.0 cm or less, wherein said second center wavelength for each of said plurality of adjacent fiber gratings is substantially equal, and wherein said semiconductor laser element comprises a reflective rear surface which forms an external resonator with said plurality of adjacent fiber gratings.

21. A method according to claim 20, further comprising:

forming a first lens that converts light emitted by said semiconductor laser element into collimated rays of light; and a second lens that focuses said collimated rays of light onto an end face of said optical fiber.

22. A semiconductor laser module according to claim 22, wherein a distance between each of said plurality of adjacent fiber gratings is no greater than 50 cm.

* * * * *